(12) United States Patent
Woods et al.

(10) Patent No.: US 8,426,725 B2
(45) Date of Patent: Apr. 23, 2013

(54) APPARATUS AND METHOD FOR HYBRID PHOTOVOLTAIC DEVICE HAVING MULTIPLE, STACKED, HETEROGENEOUS, SEMICONDUCTOR JUNCTIONS

(75) Inventors: Lawrence M. Woods, Littleton, CO (US); Joseph H. Armstrong, Littleton, CO (US)

(73) Assignee: Ascent Solar Technologies, Inc., Thornton, CO (US)

( * ) Notice: Subject to any disclaimer, the term of this patent is extended or adjusted under 35 U.S.C. 154(b) by 117 days.

(21) Appl. No.: 12/967,005

(22) Filed: Dec. 13, 2010

(65) Prior Publication Data

US 2012/0145231 A1    Jun. 14, 2012

(51) Int. Cl.
*H01L 31/00*    (2006.01)
(52) U.S. Cl.
USPC .......................................................... 136/255
(58) Field of Classification Search .................. 136/255; 257/E31.039
See application file for complete search history.

(56) References Cited

U.S. PATENT DOCUMENTS

| | | |
|---|---|---|
| 4,795,501 A | 1/1989 | Stanbery |
| 5,021,099 A | 6/1991 | Kim et al. |
| 6,048,442 A | 4/2000 | Kushiya et al. |
| 6,323,417 B1 | 11/2001 | Gillespie et al. |
| 6,372,538 B1 | 4/2002 | Wendt et al. |
| 6,974,976 B2 | 12/2005 | Hollars |
| 7,374,963 B2 | 5/2008 | Basol |
| 7,544,884 B2 | 6/2009 | Hollars |
| 7,560,641 B2 | 7/2009 | Menezes |
| 7,576,017 B2 | 8/2009 | Tuttle |
| 2006/0207644 A1 | 9/2006 | Robinson et al. |
| 2007/0093006 A1 | 4/2007 | Basol |
| 2007/0227633 A1 | 10/2007 | Basol |
| 2008/0093221 A1 | 4/2008 | Basol |
| 2008/0280030 A1 | 11/2008 | Van Duren et al. |
| 2009/0020149 A1 | 1/2009 | Woods et al. |
| 2009/0117684 A1 | 5/2009 | Basol |

(Continued)

OTHER PUBLICATIONS

Gale, R.P., et al., High-efficiency GaAs/CuInSe2 and AlGaAs/CuInSe2 thin-film tandem solar cells, May 1990, Photovoltaic Specialists Conference, Conference Record of the Twenty First IEEE pp. 53-57.

(Continued)

*Primary Examiner* — Jonathan Johnson
*Assistant Examiner* — Tamir Ayad
(74) *Attorney, Agent, or Firm* — Lathrop & Gage LLP (57) ABSTRACT

A photovoltaic (PV) device has at least one lower PV cell on a substrate, the cell having a metallic back contact, and a I-III-VI absorber, and a transparent conductor layer. An upper PV cell is adhered to the lower PV cell, electrically in series to form a stack. The upper PV cell has III-V absorber and junction layers, the cells are adhered by transparent conductive adhesive having filler of conductive nanostructures or low temperature solder. The upper PV cell has no substrate. An embodiment has at least one shape of patterned conductor making contact to both a top of the upper and a back contact of the lower cells to couple them together in series. In an embodiment, a shape of patterned conductor draws current from excess area of the lower cell to the upper cell, in an alternative embodiment shapes of patterned conductor couples I-III-VI cells not underlying upper cells in series strings, a string being in parallel with at least one stack. In an embodiment, the bonding agent is a polymeric adhesive containing conductive nanostructures. In an embodiment the III-V absorber is grown on single crystal, substrate. A method for forming the device is described.

18 Claims, 7 Drawing Sheets

U.S. PATENT DOCUMENTS

| | | | |
|---|---|---|---|
| 2009/0169723 A1 | 7/2009 | Hanket et al. |
| 2009/0199895 A1 | 8/2009 | Basol |
| 2009/0223551 A1 | 9/2009 | Reddy et al. |
| 2009/0226717 A1 | 9/2009 | Basol |
| 2009/0250722 A1 | 10/2009 | Bruce et al. |
| 2009/0255467 A1 | 10/2009 | Britt et al. |
| 2009/0255469 A1 | 10/2009 | Britt et al. |
| 2009/0258444 A1 | 10/2009 | Britt et al. |
| 2009/0258476 A1 | 10/2009 | Britt et al. |
| 2010/0133093 A1 | 6/2010 | Mackie et al. |

OTHER PUBLICATIONS

Kim, N.P. et al., Voltage-matched, two-terminal, GaAs (AlGaAs)/CuInSe2 tandem solar cells, Oct. 1991, Photovoltaic Specialists Conference, Conference Record of the Twenty Second IEEE, vol. 1, pp. 68-72.

Tatavarti, R. et al., Light weight low cost InGaP/GaAs dual-junction solar cells on 4" epitaxial liftoff (ELO) wafers, 2008, 4 pages.

U.S. Appl. No. 12/771,590, selected pages dated Sep. 3, 2012 through Jul. 7, 2011, 75 pages.

PCT/US2011/064697 International Search Report and Written Opinion mailed Jan. 22, 2013, 14 pages.

Kim, N. P. et al., High specific power (AlGaAs)GaAs/CuInSe2 tandem junction solar cells for space applications, IECEC-89., pp. 779-784 vol. 2, Aug. 6, 1989.

APPARATUS AND METHOD FOR HYBRID PHOTOVOLTAIC DEVICE HAVING MULTIPLE, STACKED, HETEROGENEOUS, SEMICONDUCTOR JUNCTIONS

FIELD

The present device relates to hybrid stacked-junction photovoltaic devices.

BACKGROUND

Photovoltaic junctions are photon-energy dependent. Typically, photons are absorbed, and electron-hole pairs created, only when an arriving photon is at least of a particular minimum energy, roughly corresponding to an energy bandgap of the photon-absorbing layer of the photovoltaic device.

The energy gap of the photon absorbing layer also relates to the maximum generated voltage output of the junction—the higher the bandgap, the greater the output voltage and the greater energy absorbed from each captured photon.

Photons having energy greater than the minimum energy for electron-hole creation tend to create heat in the absorber along with single electron-hole pairs, at typical optical energies they do not create additional electron-hole pairs, and do not boost voltage output.

Photovoltaic junctions therefore tend to act as optical low-pass filters, being transparent to photons having energy having less than the minimum energy associated with the absorbing layer; in typical single junction devices any energy carried by those photons is wasted.

Stacked-junction photovoltaic devices can take advantage of low-bandgap absorber layers to absorb more low-energy photons, while taking advantage of high-bandgap materials to capture more of the energy available in high-energy photons. By doing so, stacked junction devices can theoretically capture a greater percentage of the energy available in sunlight than single junction devices While stacked-junction photovoltaic devices are known in the art, existing devices are expensive to make and are typically not monolithically integrated into multiple-stack modular arrays. Stacked-junction devices have been made by attaching an upper photovoltaic cell complete with its own separate metal interconnect and the substrate on which it was fabricated, above a lower cell also complete with its own interconnect and substrate, a bonding agent or adhesive may be used to hold those upper cells to the lower cells. Stacked-junction devices have also been made by depositing additional thin-film semiconductor layers over a lower photovoltaic cell to form an upper photovoltaic cell overlying the lower photovoltaic cell, these devices have no bonding agent or adhesive between upper and lower cells.

Photovoltaic devices, such as some I-III-VI semiconductor-based devices, including some CIGS (Copper-Indium-Gallium-Selenide) cells, have been successfully fabricated on flexible metal or polymer substrates instead of traditional rigid substrates. These cells have ad-vantages in weight over, and may resist damage from some hazards better than, cells on traditional rigid substrates like silicon or germanium wafers or glass.

Microlink Devices, of Niles, Ill. has developed gallium-arsenide (GaAs) based photovoltaic devices on epitaxial lift-off wafers; see LIGHTWEIGHT, LOW COST GaAs SOLAR CELLS ON 4" EPITAXIAL LIFTOFF (ELO) WAFERS, R. Tatavarti, et al. $33^{rd}$ IEEE photovoltaic specialist conference, 2009 (Tatavarti). These devices are fabricated by depositing the thin films of a III-V semiconductor-based photovoltaic cell over an Aluminum Gallium Arsenide (AlGaAs) release layer on rigid, reusable, substrates. The AlGaAs layer is then etched away to release the cell from the substrate. The resulting flexible cell is reported as functioning well despite being rolled around a 35 mm mandrel.

Thin, flexible, photovoltaic devices can be adhered to a rigid or flexible substrate for use in standard rooftop applications. These flexible devices, however, can also be adhered to a flexible substrate and encapsulated with flexible materials that are not only lighter in weight than most rigid photovoltaic assemblies, are usable in stationary or rooftop applications, but can also often be folded or rolled for portability. A market for portable photovoltaic devices exists among expedition-level hikers, campers, recreational vehicle users, and the military. These devices may be used by small units for recharging batteries in the field for use in illuminated gunsights, radios, computers, and electronic map devices, navigational equipment, sensors, lights, and other devices.

SUMMARY

A photovoltaic (PV) device has at least one lower PV cell on a substrate, the cell having a metallic back contact, and a I-III-VI absorber, a heterojunction partner layer and a transparent conductor layer. An upper PV cell is adhered to the lower PV cell, electrically in series to form a stack. The upper PV cell has III-V absorber and junction layers, the cells are adhered by transparent conductive adhesive having filler of conductive nanostructures or low temperature solder. The upper PV cell has no substrate. An embodiment has at least one shape of patterned conductor making contact to both a top of the upper and a back contact of the lower cells to couple them together in series. In an embodiment, a shape of patterned conductor draws current from excess area of the lower cell to the upper cell, in an alternative embodiment shapes of patterned conductor couples I-III-VI cells not underlying upper cells in series strings, a string being in parallel with at least one stack. In an embodiment, the bonding agent is a polymeric adhesive containing conductive nanostructures. In an embodiment the III-V absorber is grown on single crystal, substrate. A method for forming the device is described. In an embodiment the upper PV cell is a flexible, thin-film, single-crystal cell "lifted off" from fabrication substrate. In an embodiment, the lower PV cell is formed on a flexible substrate.

An embodiment has shapes of a layer of patterned conductive material, such as thin-film metal or conductive ink, making contact to both upper and lower cells to couple them together in series.

A method for forming the device is described in which at least portions of the III-V upper cell is fabricated on a crystalline substrate, the upper cell is then lifted off from the substrate before being bonded to a separately-fabricated I-III-VI lower cell. Additional layers are added to the upper cell after lifting off and additional thin-film layers are added after attachment to the lower cell to integrate the device by electrically coupling multiple stacks in series, where each stack has at least one III-V and I-III-VI cell. In embodiments, scribing is done to permit the additional layers to isolate cells and make electrical contacts needed to couple cells in series.

DETAILED DESCRIPTION OF THE EMBODIMENTS

Certain III-V photovoltaic devices, such as those made from GaAs, AlGaAs, GaAsP, or InGaP, have bandgap such that the minimum energy for photon absorption is significantly greater than the minimum energy for photo absorption in some I-III-VI materials like CIGS and similar materials. Therefore, assuming no losses in interface and conductor layers, a tandem multijunction photovoltaic device made from these materials having a III-V junction above a I-III-VI junction will absorb high energy photons in the III-V junction, and some lower energy photons that penetrated the III-V layer in the I-III-VI lower junction.

Processing CIGS (Copper-Indium-Gallium-diSelenide) and related I-III-VI semiconductors such as CIS (Copper-Indium-Selenide), AIGS (Silver-Indium-Gallium-Selenide) often requires one or more high temperature processing steps to form and anneal the I-III-VI semiconductor alloy, and that those high temperature processing steps be performed in an atmosphere containing substantial selenium vapor. Similarly, GaAs, and related compounds such as Aluminum-Gallium Arsenide (AlGaAs) and Indium Gallium Arsenide-Phosphide (InGaAsP), also require high temperature processing steps to anneal, dope, and form the III-V semiconductor alloy, and these are typically performed in an atmosphere containing significant arsenic vapor (or arsenic compounds like arsine). These atmospheres are typically provided to prevent evaporation of relatively volatile elements, such as selenium, sulfur, and arsenic, and avoid depleting the semiconductors in those elements. These high temperature processing steps may, however, be incompatible with other materials in a tandem, multijunction, device—arsenic may contaminate or dope an underlying CIGS device if GaAs devices are formed and annealed over CIGS devices, and selenium may contaminate or dope an underlying GaAs device if CIGS devices are formed an annealed over the GaAs device. In addition to contamination issues, it is desirable to grow GaAs and related III-V layers on a seed crystal having similar atomic pitch because such layers provide improved performance over polycrystalline or amorphous layers. Furthermore, the I-III-VI polycrystalline devices are typically not designed to withstand the high-processing temperature of III-V based crystalline top cell deposition.

Both CIGS and GaAs devices are, however, stable under lower-temperature processing conditions such as evaporative metallization.

Figure 1:
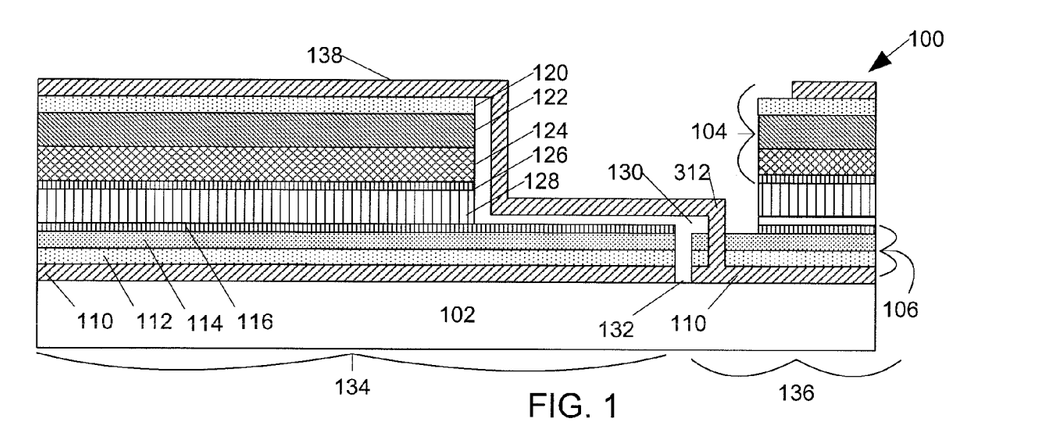
FIG. 1 is a vertically-exaggerated cross section of a tandem, multijunction, device having a III-V cell on top of an cell, showing interconnect layers.
Figure 2:
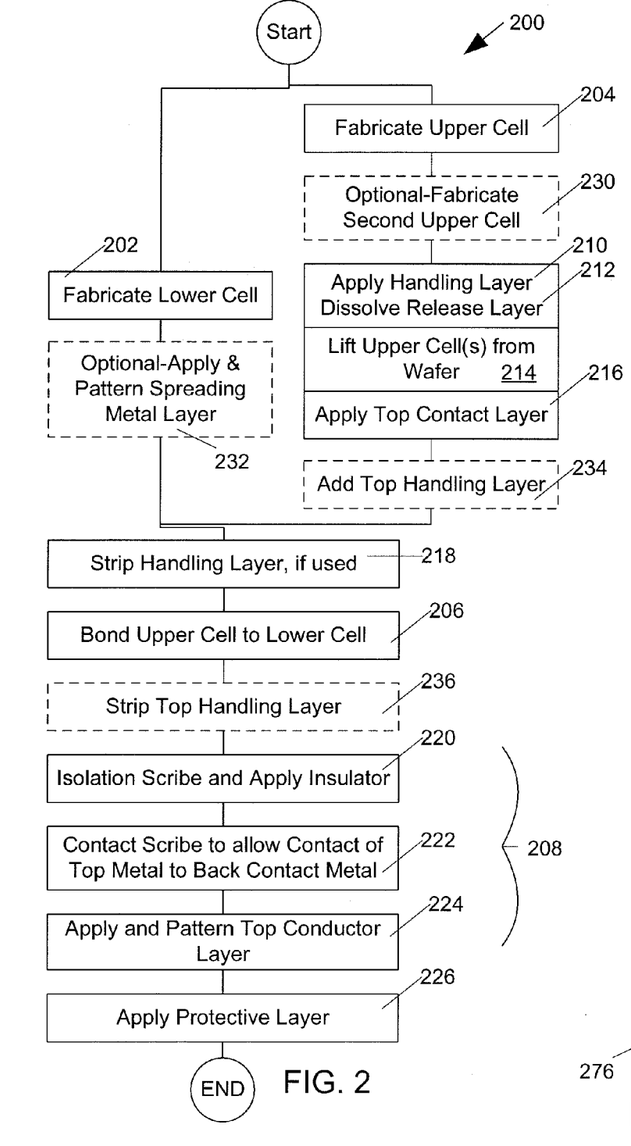
FIG. 2 is a flowchart of a process for fabricating the tandem, multijunction, device of FIG. 1.

With reference to both FIG. 1 & FIG. 2, we form a lightweight and flexible, multiple-junction, photovoltaic device 100 (FIG. 1) by separately fabricating 202 a lower, flexible I-III-VI photovoltaic junction and module, and fabricating 204 an upper, III-V, photovoltaic junction, bonding 206 both junctions together with the III-V junction 104 above the I-III-VI photovoltaic junction 106 on a flexible substrate 102, and then creating a plurality of stacked-junction devices by interconnecting 208 the stacked devices with additional layers.

Figure 2A:
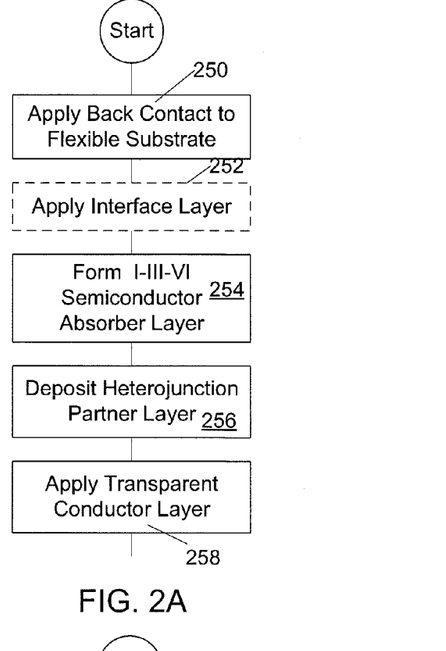
FIG. 2A is a flowchart of a process for forming the I-III-VI lower cell.

With reference to both FIG. 1 & FIG. 2A, the lower junction, or cell, of the photovoltaic device 100 is fabricated 202 by depositing 250 a metallic back-contact layer 110 on flexible polyimide substrate 10.2. Ina particular embodiment, metallic back contact layer 110 comprises primarily molybdenum. Atop back-contact layer 110 may be applied 252 an optional interface layer (not shown in FIG. 1). A I-III-VI absorber layer 112, such as a layer of CIGS, or an absorber having sublayers of CIT, CIGS, and AIGS, is formed 254 over back contact layer 110 or the optional interface layer by depositing and reacting applied elements at elevated temperature to form the I-III-VI absorber. A heterojunction partner layer 114, or emitter layer, such as a layer of cadmium sulfide (CdS) is deposited 256 to form a junction to collect carriers formed in the absorber layer 112, and a transparent conductor layer 116, such as a layer of Indium Tin Oxide (ITO) is applied 258 to facilitate collecting photocurrent. In some embodiments, a second heterojunction partner layer, or buffer layer may be applied between the first heterojunction partner layer 114 and the transparent conductor layer 116. The substrate 102, and layers 110, 112, 114, 116, form the lower junction 106 and, in a particular embodiment, are formed by process steps similar to those formerly disclosed in copending, co-owned, application Ser. No. 12/899,446, the contents of which are incorporated herein by reference.

In alternative embodiments, the I-III-VI absorber layer is a polycrystalline alloy having one or more group 1B elements selected from copper, silver, and gold; one or more group IIIa elements selected from gallium, indium, and aluminum; and one or more group VIa elements selected from oxygen, sulfur, selenium, and tellurium. Particular advantageous embodiments discussed herein incorporate one or more group 1B elements selected from copper and silver; one or more group IIIa elements selected from gallium, indium and aluminum; and one or more group VIa elements selected from selenium and tellurium; examples of I-III-VI absorber layers include CIGS, AIGS, ACIGS (silver-copper-indium-gallium-selenide), CIS (copper-indium-selenide), CIT (copper-indium-telluride), CIGT (copper-indium-gallium-telluride), CIGAT (copper-indium-gallium-aluminum-telluride), and CIGAS (copper-indium-gallium-aluminum-selenide). In some particular embodiments of these materials, oxygen may also be present in a percentage of lattice sites where selenium or tellurium is expected.

In particular embodiments, the I-III-VI absorber layer is selected from a low-bandgap alloy such as CIS, CIT, or CIGT possible. In an alternative embodiment, the absorber layer is a graded absorber layer having a I element composition graded from primarily copper at its bottom graded to primarily silver near its top, and/or a VI element composition graded from primarily tellurium near its bottom to primarily selenium near its top.

The upper portion of the photovoltaic device 100 includes layers formed separately from the layers of the lower portion, in a particular embodiment these layers are formed by an inverted growth process similar to that disclosed by Tatavarti.

Figure 2B:
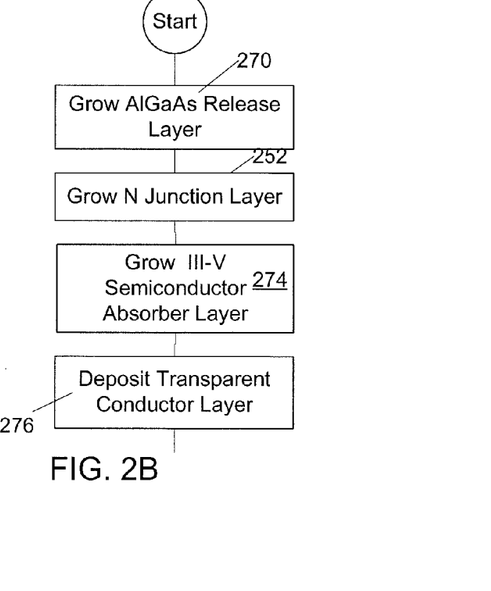
FIG. 2B is a flowchart of a process for forming the III-V upper cell.

With reference to FIG. 1 and FIG. 2B, a sacrificial release layer of AlGaAs (not shown in FIG. 1 as removed before assembly) is grown 270 epitaxially as a single-crystal on and seeded by a rigid, reusable, GaAs or Germanium (Ge) substrate (not shown in FIG. 1 as removed before assembly). An N-type single-crystal semiconductor junction layer 122 is grown 272 on, and seeded by, the AlGaAs layer. Over the junction layer 122, and seeded by the junction layer, is epitaxially grown 274 a single-crystal absorber layer 124 of III-V semiconductor.

In stacked multijunction photovoltaic devices, an upper absorber shadows the lower absorber layer over which it resides; in particular the upper absorber acts as a low-pass filter, absorbing shorter-wavelength light than that which penetrates to the lower absorber. The effective cutoff wavelength of the low-pass filter formed by the upper absorber is a function of the bandgap of the upper absorber. Under white light, a greater percentage of photons penetrates an upper absorber layer having a large bandgap than penetrates an absorber having lower bandgap. Photocurrent produced in each absorber layer is, to a first approximation, proportional to photons absorbed in that layer. If the upper and lower junctions are coupled electrically in series to form a two-junction, two-terminal device, it is desirable that photocurrent induced in the upper absorber be approximately the same as that induced in the lower absorber to optimize output. A multijunction photovoltaic device design can be adjusted somewhat by choosing a bandgap (and thus cutoff wavelength) of the upper absorber such that, under typical illumination, the photocurrents of upper and lower junctions match. For example, AlGaAs tends to have a higher bandgap than GaAs.

In a particular embodiment the III-V semiconductor is a single junction device from the InGaAsP material system with bandap designed to match that of the total current generated from the I-III-VI bottom cell. In this embodiment, the I-III-VI bottom cell includes areas both under and areas not under the III-V based top cell. In an embodiment that shows the utility of the concept, the uncovered bottom cell areas enable a relatively low-bandgap III-V top cell, such as a cell having a GaAs absorber, to be utilized in a two-terminal, current matched configuration. In another embodiment, the upper III-V semiconductor is a dual junction device having two junctions both from the InGaAsP material system; in a particular embodiment the upper III-V device is a dual junction device with an InGaP top cell on a GaAs mid-bandgap cell; this dual junction device is placed over a I-III-VI bottom cell as herein described.

An interface layer (not shown) and a transparent conductor layer 126, such as a layer of ITO, is deposited 276 over the absorber layer. With reference to FIG. 1 and FIG. 2, an optional, sacrificial, bottom handling layer (not shown in FIG. 1 as removed before assembly) may be applied 210 over conductor layer 126. A handling layer is typically a layer of metal or of polymeric material added to a fully or partially fabricated cell to mechanically thicken and strengthen the cell during further processing and/or assembly steps; handling layers may be removed at later stages of processing and/or assembly of the device. A handling layer may be applied as a sticky tape, or as a paint or dissolved resin brushed, sprayed, or rolled onto the device and allowed to harden thereon.

In various embodiments, additional layers or sublayers, such as emitter and buffer layers, may be included in addition to those illustrated and described herein with reference to the I-III-VI lower cell and the III-V upper cell. Further, individual layers, such as the I-III-VI absorber layer, may be deposited or grown as a sequence of sublayers to produce a layer having a graded composition where such graded composition provides improved performance. In a particular embodiment, for example, the I-III-VI absorber layer may be deposited as a sequence of sublayers so that the final absorber layer has group-I content primarily copper at its lower surface tapering to primarily silver at its upper surface. Similarly, the III-V upper cell junction and absorber layers may be applied as a sequence of lightly and heavily doped materials to produce N and N+ and/or P and P+ sublayers within these layers to enhance performance of the photovoltaic junction, and to improve ohmic contact to conductor layers.

In alternative embodiments, the III-V absorber layer is a crystalline alloy having one or more group IIIa elements selected from gallium, indium, and aluminum; and one or more group Va elements selected from nitrogen, phosphorus, arsenic, antimony, and bismuth. Particular advantageous embodiments discussed herein incorporate one or more group IIIa elements selected from gallium, indium and aluminum; and one or more group Va elements selected from phosphorus, and arsenic; examples of III-V absorber layers include GaAs, GaInP, and AlInP. In some particular embodiments of these materials, nitrogen may also be present in a percentage of lattice sites where arsenic or phosphorus is expected. In an alternative embodiment, the III-V absorber layer embodies substantial nitrogen, and may be a gallium or indium nitride.

The AlGaAs sacrificial release layer is then dissolved 212 by etching to release the top cell 104 from the substrate, the top cell is then lifted 214 off of the substrate. A transparent upper conductor layer 120 is then applied 216 to the top cell 104 on its top, on junction layer 122, which was formerly adjacent to the release layer. Any bottom handling layer is then stripped 218. The top cell therefore has no separate substrate, and any handling layer attached to the top cell is not a substrate because it was not present during formation of the top cell junction and absorber layers.

Figure 2C:
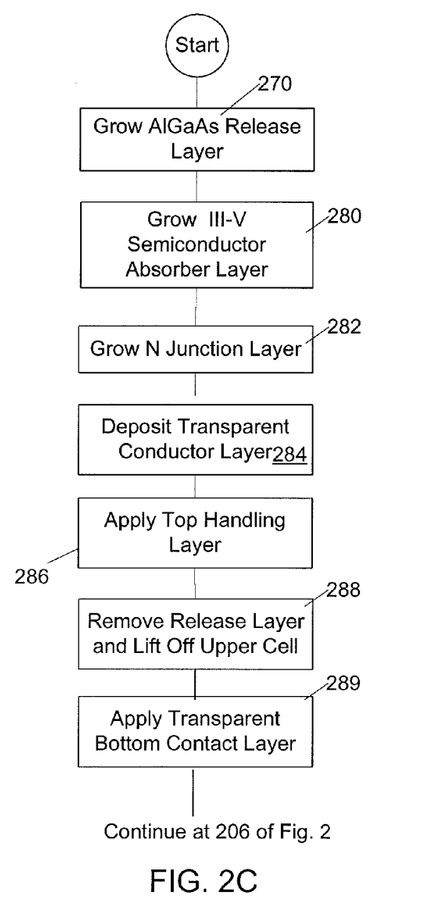
FIG. 2C is a flowchart of an alternative process for forming the III-V upper cell.

In an alternative embodiment, as illustrated in FIG. 2C, the upper cell is prepared in a bottom-to-top manner instead of the inverted, top-to-bottom manner discussed with reference to FIG. 2B. In this embodiment, the single-crystal AlGaAs sacrificial release layer is grown epitaxially 270 on a single-crystal substrate. After this layer is grown, absorber layer 124 is grown 280 on the release layer. Next, a single-crystal, III-V, junction layer 122 is grown 282 on the absorber layer 124 to create the photodiode. Next, the transparent upper conductor layer 120, which may be ITO, and any necessary interface or barrier layers (not shown) are deposited on the junction layer. A top handling layer (not shown as removed before completion) is then applied to the cell to strengthen it to enable handling. In this embodiment, no bottom handling layer is used. The release layer is then removed, and the cell lifted off of the reusable, single-crystal, substrate. The top-cell bottom contact layer 126 is then added 289 and processing continues with step 206 of FIG. 2 by bonding the top cell to the bottom cell. In an embodiment, an additional, patterned, layer of metal 406 (FIG. 7) may be added prior to bonding the upper to the lower cell.

Next the top cell 104 is bonded 206 to lower cell 106 with a layer of transparent, electrically conductive, polymeric adhesive 128 bonding agent. In an embodiment, adhesive 128 is a transparent silicone having an electrically conductive filler of conductive nanostructures. In a particular embodiment the nanostructures are silver nanowires. In an alternative embodiment, the nanostructures are carbon nanotubes. In a further embodiment the nanostructures are preferentially oriented to enhance the perpendicular electrical conduction and minimize the lateral or in-plane optical absorption or reflection cross-section to avoid undue shadowing of the long-wavelength, low-energy light that penetrates top cell 104 to reach bottom cell 106. In the case of nanostructured nanowires, the length may considerably exceed width, with length-to-width aspect ratios of 10 or more.

The adhesive 128 provides a path for electrical current from the transparent conductor layer 116 atop the lower cell 106 to transparent conductor layer 126 that forms a backside contact to III-V absorber layer 124. In an alternative embodiment, not shown, a first grid of patterned, conductive, metal is applied to the bottom of the top cell and a second grid to the top of the bottom cell (232), this grid may have identical patterning on both the first and second grids to minimize shadowing, and these grids are connected to each other at one edge by a thin foil that is bonded to busbars of each grid to form a closable hinge between the top and bottom cell. A nonconductive adhesive layer is then applied to the upper surface of the bottom cell, and the top cell is folded over the bottom cell. In this alternative embodiment the adhesive need not be electrically conductive, and the grid pattern could be further matched with the top grid on the top of the top cell (310) to further minimize shadowing. In this alternative embodiment, processing continues with laser scribe 220, application of a patterned insulator layer 130, and application of top conductive layer 138 for interconnection of the cell rows.

Next, a first, isolation, laser scribe is performed 220 to isolate cell rows, such as first cell row 134 from second cell row 136, and a transparent patterned insulator layer 130 is added to prevent shorting of the top cell by an interconnect conductor layer 138; this isolation laser scribe 132 cuts through all layers of the device except for the substrate, including cutting through back-contact layer 110. A second, contact, laser scribe is performed 222 near or adjacent to the isolation laser scribe, however this laser scribe cuts through only those layers above the molybdenum back-contact layer 110 of lower cell 106.

An insulator layer 130 is patterned to provide shapes 345 of insulator material that prevent shorting of the cells by interconnect layer 138, these shapes 345 (FIG. 4A) may cover portions of the top cell edge, bottom cell edge, and bottom cell upper conductor layer 118, that underlie shapes of patterned conductor layer 138 where contact is undesirable. Shapes of insulator layer 130 may be applied by screen printing of an insulating ink, by chemical vapor deposition followed by masking and etching, by inkjet printing, or through another suitable application method as known in the art of photovoltaic cells and integrated circuitry. Insulator layer 130 is patterned to be absent where contact between shapes of patterned conductor layer 138 and underlying conductor layers, such as top cell transparent conductor 120, bottom cell back contact 110, or bottom cell top transparent conductor 116 is desired.

In embodiments, shapes of patterned conductor layer 138 may be applied as a thin film by chemical vapor deposition or by evaporation of an appropriate metal; following which undesired portions may be removed by photolithography or etching to leave desired shapes, such as shapes 310, 346 on the device. In alternative embodiments, shapes 310, 346 of patterned conductor layer 138 are applied by screen printing or inkjet printing of an electrically highly-conductive ink, such as an ink having a high content of silver in a binder.

As described above, the I-III-VI cells are formed as a continuous structure that is then partitioned into individual cells by scribing, the individual cells being those of each cell row-such as lower I-III-VI cells 302, 304. Similarly, layers of cells are selectively removed in contact areas to expose the back contact layer 110 to permit shapes of the patterned conductive layer to reach and contact the back contact layer. In alternative embodiments, partitioning of the lower I-III-VI cell, and exposure of the back contact layer 110 is performed with other techniques than laser scribing. In embodiments, these other techniques are selected from other patterning techniques known in the art of integrated circuit and photovoltaic device manufacture such as photolithography and etching; this partitioning is typically performed without severing or cutting the underlying flexible substrate 102.

A conductive top layer 138 is then applied 224 and patterned such that patterned conductor layer 138 covers no more than a small percentage of total surface area of the hybrid device 100, while serving to collect current from upper cell 104 of first cell row 134 and feeding that current to the back contact layer 110 of lower cell 106 of second cell row 136. Patterned conductor layer 138 therefore serves to couple cells of the first cell row electrically in series with cells of the second cell row.

Next, a transparent protective layer, such as a layer of silicone polymer, not shown in FIG. 1 for simplicity, is applied 226 over the entire device to protect the device, including protecting shapes of patterned conductive layer 138.

In another alternative embodiment, a current-spreading conductive layer is applied 232 and patterned after fabricating 202 the lower cell on top of transparent conductor 116. This current-spreading conductive layer serves to reduce the effective resistance of the transparent conductor layer 116 that collects current from the lower cell; this layer is preferably patterned as a grid that covers only a few percent of the lower cell, and matches the pattern and aligned with the grid on the top of the top cell (310).

In yet another alternative embodiment a second, top, handling layer is added 234 to the upper cell after the top contact transparent conductor layer 120 is applied 216. If used, this top handling layer is stripped 236 after the upper cell is bonded to the lower cell.

Figure 3:
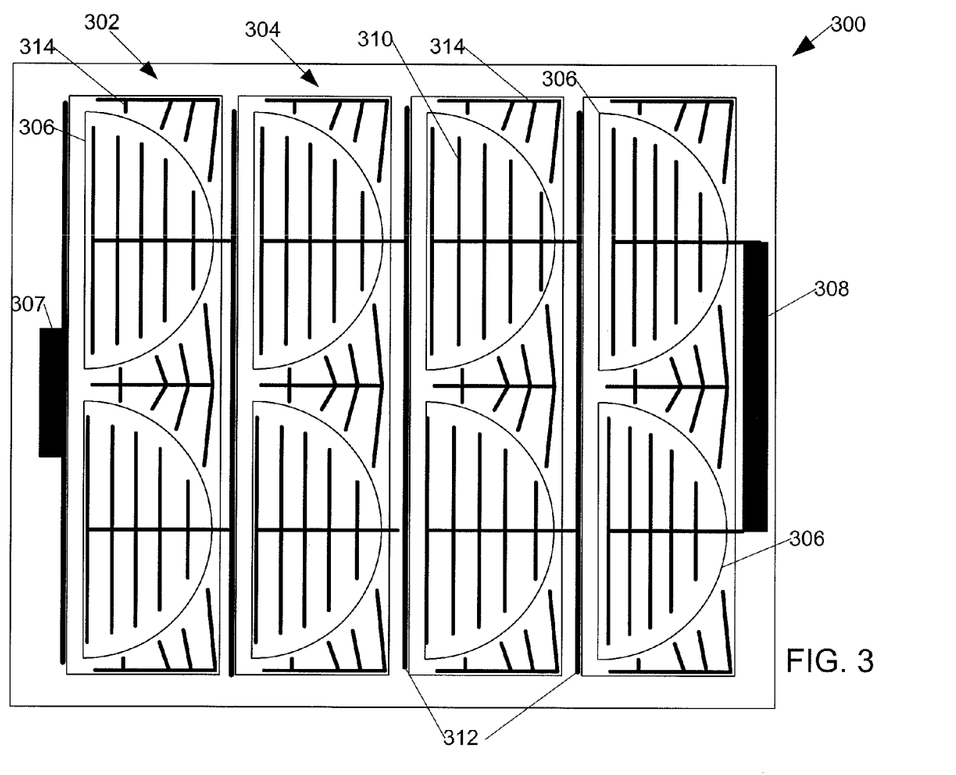
FIG. 3 is a top plan view of a module showing an arrangement of the III-V cells on I-III-VI cells, with a single, top, patterned, metal interconnect, as illustrated in FIG. 1.
Figure 3A:
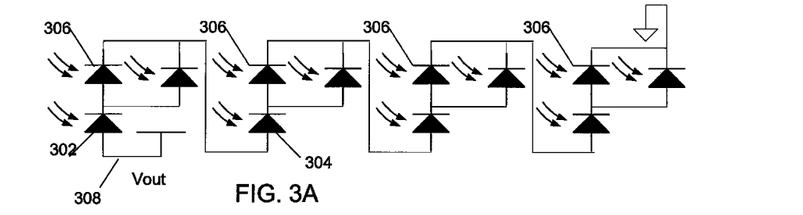
FIG. 3A is a schematic diagram of the module of FIG. 3.
Figure 4:
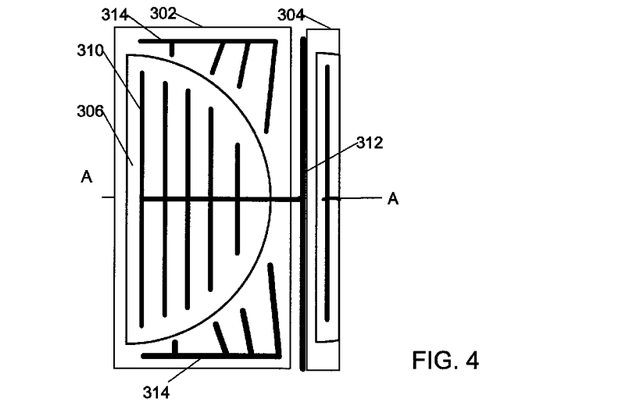
FIG. 4 is a closeup view of a portion of the module of FIG. 3

The process of FIG. 2 produces a hybrid photovoltaic module 300 (FIG. 3. FIG. 4 is a closeup of a portion of FIG. 3, and FIG. 3A is an electrical schematic diagram of a portion of a module having 4 rows) having multiple rows. Each row has a large, lower, lower I-III-VI photovoltaic cell 302, 304, electrically coupled in series with a group of parallel-connected upper III-V cells 306. The embodiment of FIG. 3 uses semicircular III-V cells 306 from round surrogate wafers to avoid wastage of this relatively expensive material; the semicircular III-V cells fail to cover significant available I-III-VI cell area of the module which have "excess area" relative to the III-V cells. Rows are electrically coupled together in series, with a positive contact 307 and negative contact 308 formed in patterned conductor layer 138. Positive contact 307 and negative contact 308 are typically bonded to wires useable to connect module 300 to a load.

The module of FIGS. 3 and 3A is illustrated with one patterned conductive layer 138. This conductor layer is grid 310 that serves to collect current from the upper, III-V, cells of each row. In an embodiment, grid 310 covers five percent or less of each cell 306. Grid 310 extends to a scribeline contact 312 where grid 310 contacts back metal layer 110 to connect the tops of one row 302 of III-V cells 306 to bottoms of the next rows I-III-VI cells, 304. Electrical continuity of the portion of the deposited patterned conductive layer shape 138 that connects the top grid 310 to the back contact layer 110 over the step formed by thickness of the upper cell is enabled by the thin step height allowed by the thin adhesive layer and thin, substrate-free, lifted-off III-V top cell device stack 104. FIG. 1 is an exaggerated cross section of as portion of FIG. 4 taken along the line A-A in FIG. 4. The patterned conductive layer also forms a spreading grid shape 314 that helps collect current from a top portion, or the "excess area" of each lower, I-III-VI cell that is not covered by a III-V top cell, and conduct this current with minimum resistance to those portions of transparent conductive layer 116 that underlie upper, III-V, cell 306. This enables an approximately constant voltage layer 116, 314 over the entire cell upper surface, and where bottom cell (I-III-VI device) areas without III-V cell coverage provide additional current to the bottom cell to enable better current matching with the III-V top cells. The output voltage at module output 308 is derived from four stacks or rows in series, where each stack (row) has one cell in series with two parallel III-V cells 306. The present process may be used to produce modules having any number of parallel III-V cells in a stacks (row) and any number of stacks (rows) coupled in series.

It is known that, for maximum efficiency of a stacked, heterogeneous, photovoltaic device, such as is illustrated in FIGS. 3 and 3A, where current in each cell of a stack is forced to be equal through series connection, the photocurrent at maximum power produced by the lower cell should be approximately equal to a photocurrent at maximum power produced by upper II-V cells in each stack, and the photocurrent in each stack (row) in a series-connected string must also be matched. Matching photocurrents at maximum power in an embodiment is done by design with respect to a given spectral distribution of arriving photons. In an embodiment, the particular III-V material used is selected, and the area of the underlying and interconnected I-III-VI cells sized, such that the photons expected to reach the I-III-VI cell will produce approximately the same photocurrent at maximum power as that produced in the III-V cell.

Figure 5:
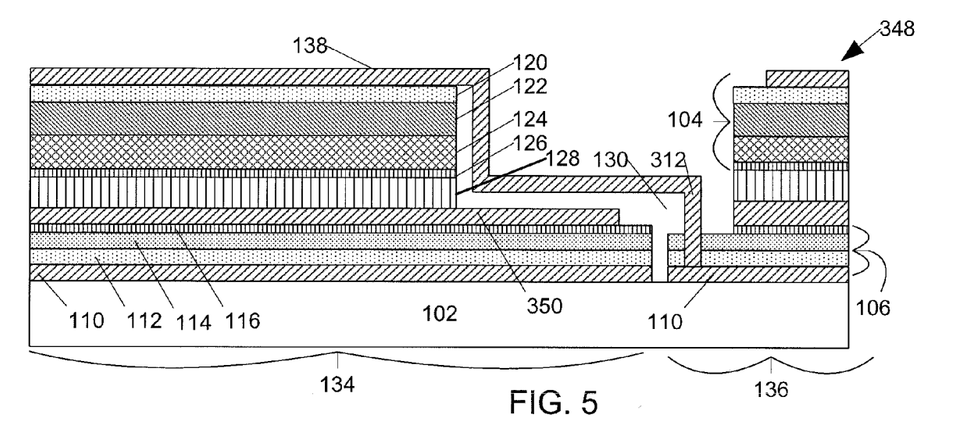
FIG. 5 is a vertically-exaggerated cross section of an alternative tandem, multijunction, device having a III-V junction on top of a I-III-VI junction, showing interconnect layers.

In the embodiment 348 illustrated in FIG. 5, excess I-III-VI cell area is required in each row of a module to provide a matching photocurrent for a particular upper cell, but in this embodiment the transparent conductor layers 116, 126 on top of the I-III-VI cell and bottom of the upper III-V cell have high enough resistivity to cause a loss of potential output power. In such an embodiment, an additional patterned conductive layer 350, patterned so as to block less than a small percentage, such as five percent, of the surface area of the lower, I-III-VI cell, may be added to collect current from those areas of the lower cells 106 that are not covered by the III-V upper cells, and to provide additional current to help match the maximum power current of the III-V upper cells 104. Patterned conductors on this layer 350 may be used instead of, or in parallel to, conductors of spreading grid 314. Most layers on FIG. 5 are similar to layers of FIG. 1, and are identical to those layers of FIG. 1 having the same reference numbers, these descriptions will not be repeated here for simplicity.

Figure 3B:
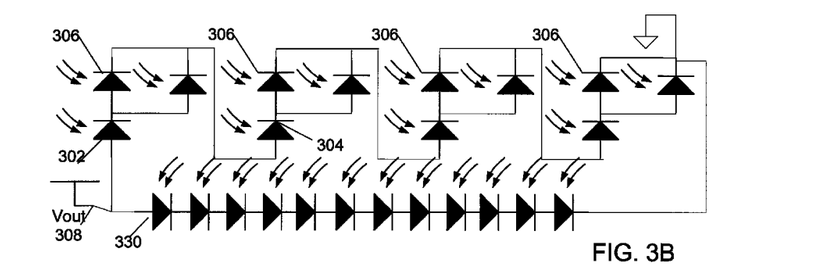
FIG. 3B is a schematic diagram of an alternative module using the device of FIG. 1.
Figure 4A:
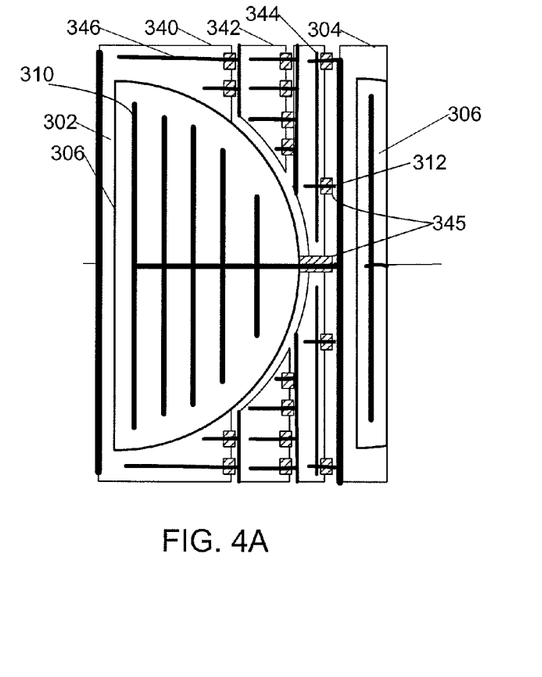

In an alternative embodiment where more total I-III-VI cell area is available in each row than is required to provide a photocurrent that approximately matches photocurrent expected to be produced by the upper III-V cell, the module is designed to make use of the excessive I-III-VI cell area by dividing the excess I-III-V cell area into multiple, smaller, photovoltaic cells 330 (FIG. 3B). These small I-III-VI cells 330, 340, 342, 344 are coupled in series using the top patterned conductive layer 346 such that an appropriate are electrically coupled in series and coupled in parallel to voltage match with one or several of the aforedescribed stacks of I-III-VI and III-V photovoltaic cells. Since these I-III-VI cells have narrower bandgap than upper III-V cells, each such cell typically has a lower maximum power point voltage than the upper III-V cells. As such, the total number of these small I-III-VI cells coupled in series in a string is greater than the number of cells in the one or more stacks of I-III-VI and III-VI cells that that string is tied in parallel with. In FIG. 4A, three I-III-VI cells are paralleled with a single stack of one I-III-VI cell and one III-V cell; in alternative embodiments, a series string of N I-III-VI cells 330 may be tied in parallel with M stacks, where each stack has one I-III-VI cell and one III-V cell. FIG. 3B illustrates N=12 and M=4. The overall arrangement of strings and stacks in a module is series-parallel to achieve suitable output levels.

In some alternative embodiments, some of the I-III-VI lower cell area not covered by III-V upper cells is used for current matching, and a spreading grid shape 314 provided to draw current from those portions towards the upper cell of stacks; while remaining I-III-VI cell area is divided into small I-III-VI cells that are coupled into series strings like those of FIG. 4A and paralleled with stacks. These alternative embodiments allow designers to optimize power production by making use of all available I-III-VI cell area while providing only enough lower I-III-VI cell area in each stack to match the photocurrent produced by overlying III-V upper cells.

Figure 6:
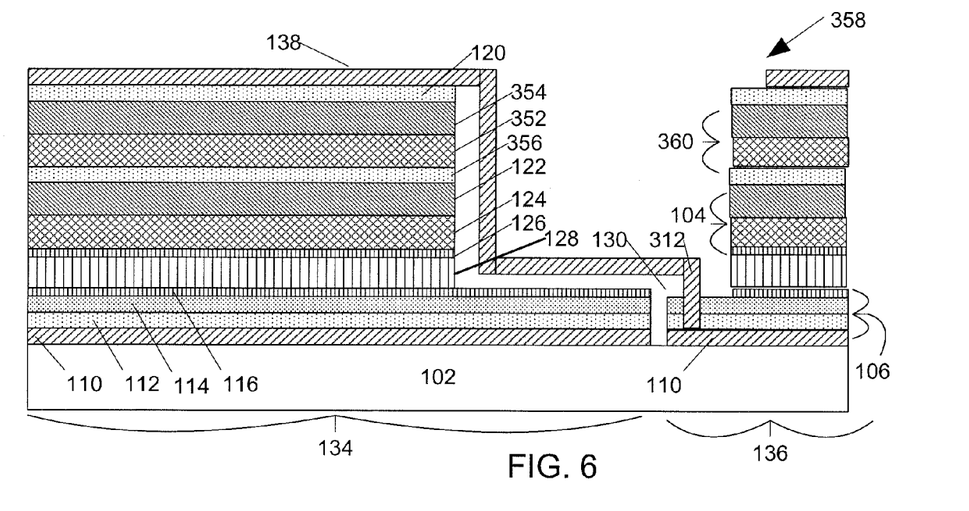
FIG. 6 is a vertically-exaggerated cross section of an alternative multijunction, photovoltaic device having two stacked III-V junctions on top of a I-III-VI junction, showing interconnect layers

In another alternative embodiment 358, a second upper cell 360 may be fabricated 230 after fabricating the first upper cell 104, the first upper cell 104 becoming an intermediate cell and second upper cell 360 becoming a top cell in a three-junction, multilayer, photovoltaic device as illustrated in FIG. 6. Second upper cell 350 has a III-V absorber layer 352, and an N-type junction layer 354. III-V absorber layer 352 has a higher bandgap, and a higher minimum photon energy for absorption, than does the III-V absorber layer 124 of the first upper cell 104. This energy difference is achieved by using a different III-V material for upper cell 360 than for lower cell 104.

In a particular embodiment, upper III-V absorber layer 352 is InGaP, lower III-V absorber layer 122 is GaAs, and the lower I-III-VI absorber layer 112 is selected from CIT or CIS, or is a graded absorber layer comprising CIAS or CIGS transitioning to CIS.

Figure 7:
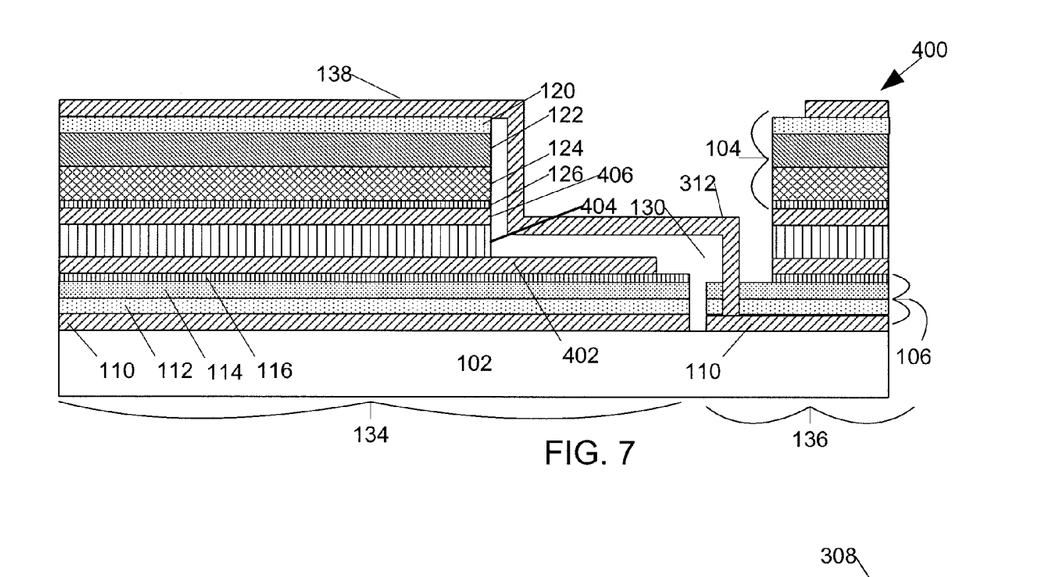
FIG. 7 is a vertically-exaggerated cross section of an alternative tandem, multijunction, device having three patterned conductive layers.
Figure 8:
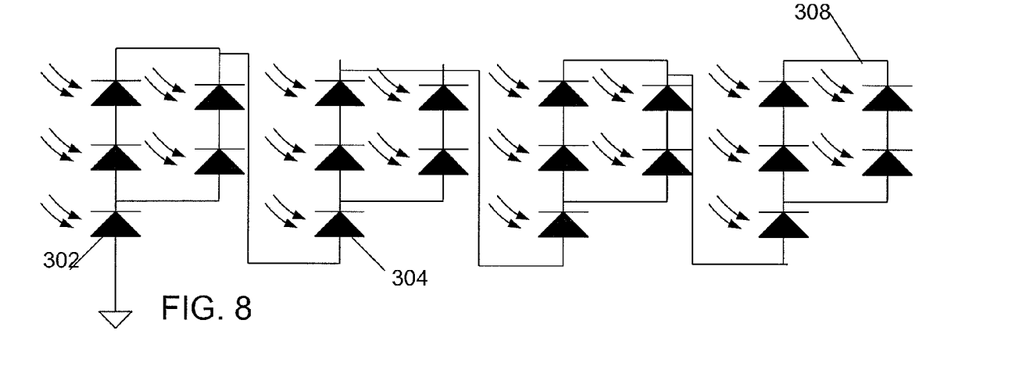
FIG. 8 is a schematic diagram of a module using devices of FIG. 6.

In yet another alternative embodiment 400, as illustrated in FIG. 7, an additional patterned conductive layer 402, patterned so as to block less than a small percentage, such as five percent, of the surface area of the lower, I-III-VI, cell is used to collect current from the lower cells 106, including areas that are, and are not covered by the III-V upper cells 104, and to bring this current under the III-V upper cells 104. This additional patterned conductive layer 402, which may be metal, resembles patterned conductive layer 350 of FIG. 5, but may be metal. Further, conductive layer 402 may have a low temperature solder 404 plated on top of it. A second additional patterned conductive layer 406, patterned so as to block less than a small percentage, such as five percent, of the surface area of the lower, I-III-VI, cell, and aligned to additional patterned conductive layer 404 so that much, if not all, of additional patterned conductive layer 404 overlies metal layer 406, is applied on top of the upper cell during fabrication 204 so as to underlie transparent conductor layer 126 when the upper cell 104 is placed on lower cell 106. The low temperature solder, in a particular embodiment having a melting point between 100 and 200 C, is then reflowed to bond the upper and lower cells together and transfer current from lower cell to upper cell. In an alternative embodiment, a conductive adhesive may be used to bond shapes of the additional conductive layers together to transfer current from upper to lower cells.

Since all the layers are thin, the entire hybrid multijunction photovoltaic device is flexible and can be rolled for shipment and storage.

In alternative embodiments, rectangular upper cells 306 may be used instead of the semicircular cells illustrated, as long as current matched bottom cells can be provided either in entirety under the upper cells 306, or with excess area not under cells 306 to enable better current matching and more efficient module or a module with higher power per unit weight (watts per kilogram).

In an alternative embodiment, top cell 104 embodies newly developed quantum-dot technology. Aside from fabrication of top cell 104, remaining steps are as otherwise herein described.

After the III-V cells are applied over the I-III-VI cells, the I-III-VI cells are partitioned, including application of insulating shapes, overlying patterned metal or other patterned conductive materials are applied to provide shapes electrically interconnecting the cells as described above, and protective layers are applied, the assembly is divided by cutting into individual modules and connections are added to connect each module to external circuitry of a system.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A photovoltaic (PV) device comprising:
   at least a first and a second lower PV cell, each further comprising:
      a substrate;
      a metallic back contact layer,
      a I-III-VI semiconductor absorber layer,
      a heterojunction partner layer, and
      a transparent conductor layer;
   at least one upper PV cell further comprising:
      a III-V semiconductor absorber layer,
      a semiconductor junction layer, and
      a top transparent conductor layer;
   at least one conductive shape of a patterned conductive layer, the shape applied over and making contact with the top transparent conductor layer of the at least one upper PV cell, the shape isolated from the transparent conductor layer of the first and second lower PV cells, and coupled to the back contact layer of the second lower PV cell, the shape serving to couple a stack comprising the upper and first lower PV cells in series with the second lower PV cell;
   an electrically conductive bonding agent adhering the at least one upper PV cell to the first lower PV cell, the at least one upper PV cell disposed to receive light, and the first lower PV cell disposed to receive light that penetrates the at least one upper PV cell, the bonding agent capable of transmitting at least some light, the electrically conductive bonding agent electrically coupling the at least one upper PV cell in series with the first lower PV cell; a string, comprising a plurality of first I-III-VI cells electrically coupled in series without III-V cells, and the string being coupled in parallel with the stack, and at least one of the plurality of the I-III-VI cells adjacent to the first lower PV cell; and at least one additional shape of the patterned conductive layer, the at least one additional shape making contact only to the transparent conductor layer of the first lower PV cell not covered by the at least one upper PV cell, the at least one additional shape serving to reduce effective resistance for current flow from at least some portions of the first lower PV cell not covered by the at least one upper PV cell to the at least one upper PV cell; wherein the at least one upper PV cell has no single-crystal substrate present in the device.

2. The PV device of claim 1 wherein shapes of the at least one patterned layer of conductive material electrically couples multiple stacks of upper and lower PV cells in series.

3. The PV device of claim 1 wherein the I-III-VI semiconductor absorber layer comprises at least one of silver and copper, comprises at least one of indium and gallium, and comprises at least one of selenium and tellurium.

4. The PV device of claim 3 wherein the I-III-VI semiconductor absorber layer is copper-indium-gallium-diselenide.

5. The PV device of claim 1 wherein the III-V semiconductor absorber layer of at least one upper PV cell is single-crystal.

6. The PV device of claim 1 wherein the bonding agent is a transparent polymeric material having a conductive filler, the conductive filler comprising at least one of silver nanowires or carbon nanotubes.

7. The PV device of claim 3 wherein the III-V semiconductor absorber layer comprises at least one of gallium, indium and aluminum, and at least one of arsenic and phosphorus.

8. The PV device of claim 7 wherein the III-V semiconductor absorber layer comprises indium, gallium, and phosphorus.

9. The PV device of claim 3 further comprising a second upper PV cell, the second upper PV cell further comprising:
   a second III-V semiconductor absorber layer, and
   a second semiconductor junction layer.

10. The PV device of claim 1 wherein the III-V semiconductor absorber layer comprises indium, gallium, and phosphorus.

11. A photovoltaic (PV) device comprising:
    at least a first and a second lower PV cell, each further comprising:
       a substrate;
       a metallic back contact layer,
       a I-III-VI semiconductor absorber layer,
       a heterojunction partner layer, and
       a transparent conductor layer;
    at least one upper PV cell further comprising:
       a III-V semiconductor absorber layer,
       a semiconductor junction layer, and
       a top transparent conductor layer; and
    layers providing electrical conduction between the transparent conductor layer of the first lower PV cell and the III-V semiconductor absorber layer of the at least one upper PV cell, the first lower PV cell and the at least one upper PV cell thereby coupled in series as a stack;
    at least one shape of a patterned conductor layer providing electrical contact between the metallic back contact layer of the second lower PV cell and the top transparent conductor layer of the at least one upper PV cell; and at least one additional shape of the patterned conductor layer providing electrical contact to the transparent conductor layer of portions of the first lower PV cell not covered by the at least one upper PV cell, the additional shape providing a reduced resistance for current flow to the top transparent conductor layer of the at least one upper PV cell relative to current flow through the transparent conductor layer of the first lower PV cell; wherein the at least one upper PV cell has no single-crystal substrate present in the device; and wherein the at least one upper PV cell intentionally fails to cover a significant portion of the first lower PV cell, at least some of the uncovered area contributes to photo-generated current of the device.

12. The photovoltaic device of claim 11 wherein the patterned conductor layer comprises metal.

13. The device of claim 11 wherein the layers providing electrical conduction between the transparent conductor layer of the first lower PV cell and the III-V semiconductor absorber layer further comprise an electrically conductive adhesive adhering the at least one upper PV cell to the first lower PV cell, the adhesive capable of transmitting at least some light.

14. The photovoltaic device of claim 13 further comprising:

at least one string comprising a plurality of I-III-VI cells electrically coupled in series without III-V cells, wherein the string is coupled in parallel with at least one stack.

15. The device of claim 11 wherein the layers providing electrical conduction between the transparent conductor layer of the first lower PV cell and the III-V semiconductor absorber layer comprise a layer of low temperature solder.

16. The photovoltaic device of claim 15, further comprising:

at least one string comprising a plurality of I-III-VI cells electrically coupled in series without III-V cells, wherein the string is coupled in parallel with at least one stack.

17. The PV device of claim 11 wherein the I-III-VI semiconductor absorber layer comprises at least one of silver and copper, comprises at least one of indium and gallium, and comprises at least one of selenium and tellurium.

18. The PV device of claim 11 wherein the III-V semiconductor absorber layer comprises at least one of gallium, indium and aluminum, and at least one of arsenic and phosphorus.

* * * * *